(12) United States Patent
Riggle et al.

(10) Patent No.: US 6,587,977 B1
(45) Date of Patent: Jul. 1, 2003

(54) O,K,M,/M RECORDING CODE

(75) Inventors: C. M. (Mike) Riggle, Colorado Springs, CO (US); John W. VanLaanen, Louisville, CO (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/455,624

(22) Filed: Dec. 6, 1999

(51) Int. Cl.$^7$ ............... G06F 11/00; G11C 29/00; H03M 7/00
(52) U.S. Cl. ............ 714/701; 714/769; 341/59
(58) Field of Search ................ 714/701, 758, 714/766, 769, 775, 789, 798, 811, 746; 365/200, 201; 341/59

(56) References Cited

U.S. PATENT DOCUMENTS

| | | | |
|---|---|---|---|
| 5,760,717 A | * 6/1998 | Scholz | 341/58 |
| 6,167,550 A | * 12/2000 | Gray | 714/769 |
| 6,177,890 B1 | * 1/2001 | Keirn et al. | 514/342 |
| 6,229,459 B1 | * 5/2001 | Noda | 341/59 |
| 6,314,534 B1 | * 11/2001 | Agrawal et al. | 714/702 |

* cited by examiner

*Primary Examiner*—Albert Decady
*Assistant Examiner*—Matthew C. Dooley
(74) *Attorney, Agent, or Firm*—Tejpal S. Hansra

(57) ABSTRACT

A method for encoding data to meet a maximum run length limitation is disclosed. In one embodiment, the method comprises the steps of: (1) providing user data that includes a plurality of bits, wherein said bits have a value of 1 or 0; (2) performing an ECC computation on said plurality of user data bits to add ECC symbols in the form of a plurality of ECC bits; (3) randomizing the plurality of user data bits and said plurality of ECC bits; (4) analyzing said randomized user data bits and ECC bits to determine whether a number of consecutive bits have a common value; and, (5) inverting the value of a bit, when the number of consecutive bits having a common value exceeds the maximum run length limitation. Subsequently, representations of each of the randomized user bits and ECC bits, including any inverted bits, are stored onto a disk surface as magnetic-polarity transitions. Later, the stored magnetic-polarity transitions are read from the disk surface and the randomized user bits and ECC bits, including any inverted bits, are recovered. The randomized user bits and ECC bits are derandomized, and the value of the inverted bit is inverted to its original value using the ECC computations. Accordingly, the original user data is recovered.

71 Claims, 3 Drawing Sheets

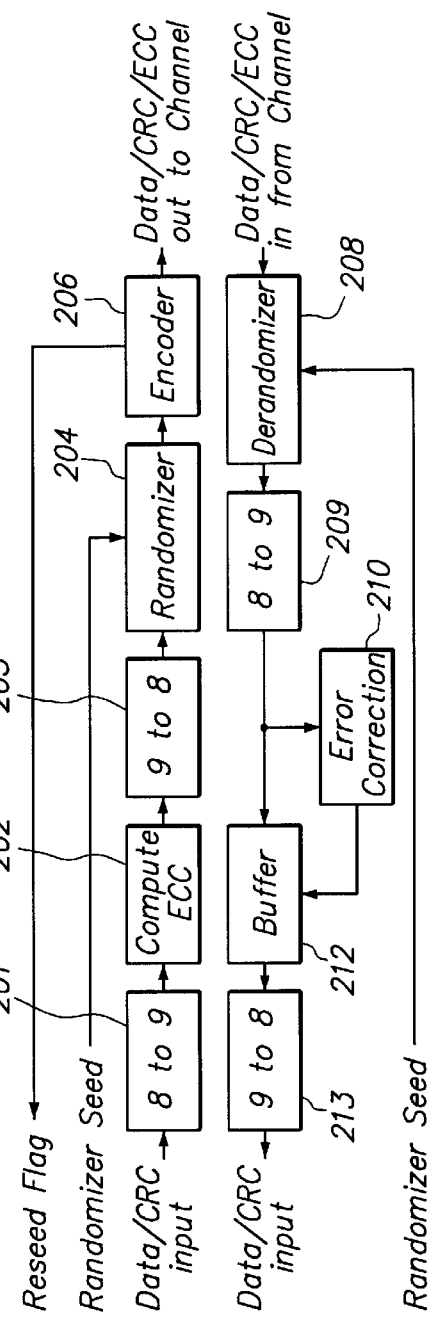
FIG. 2 High-Level System Architecture for the 0,k,m/m Recording Code
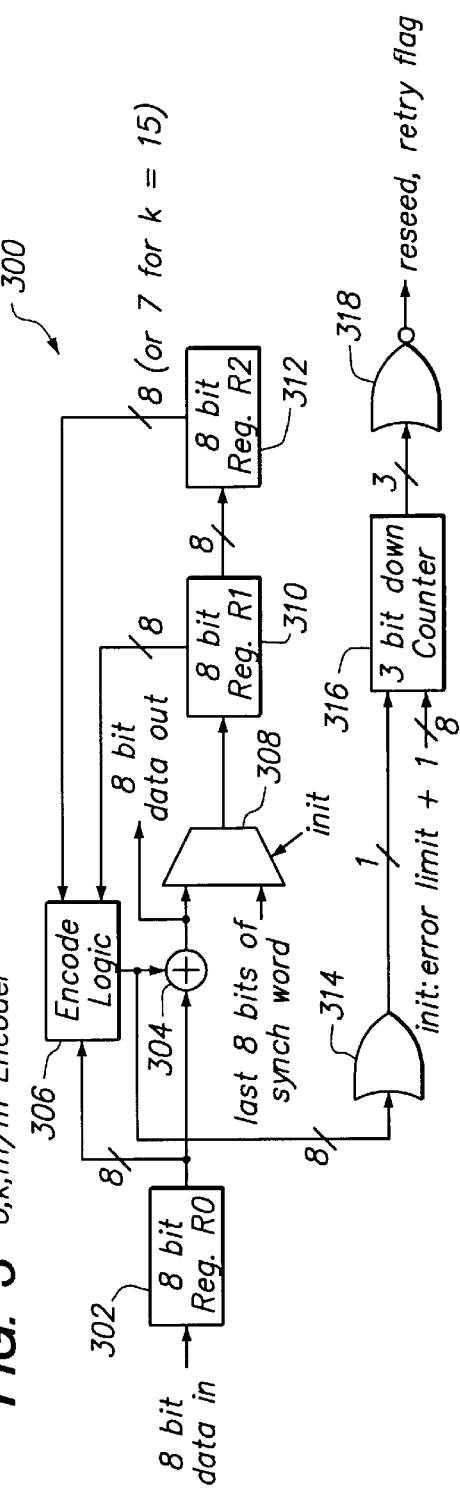
FIG. 3 0,k,m/m Encoder

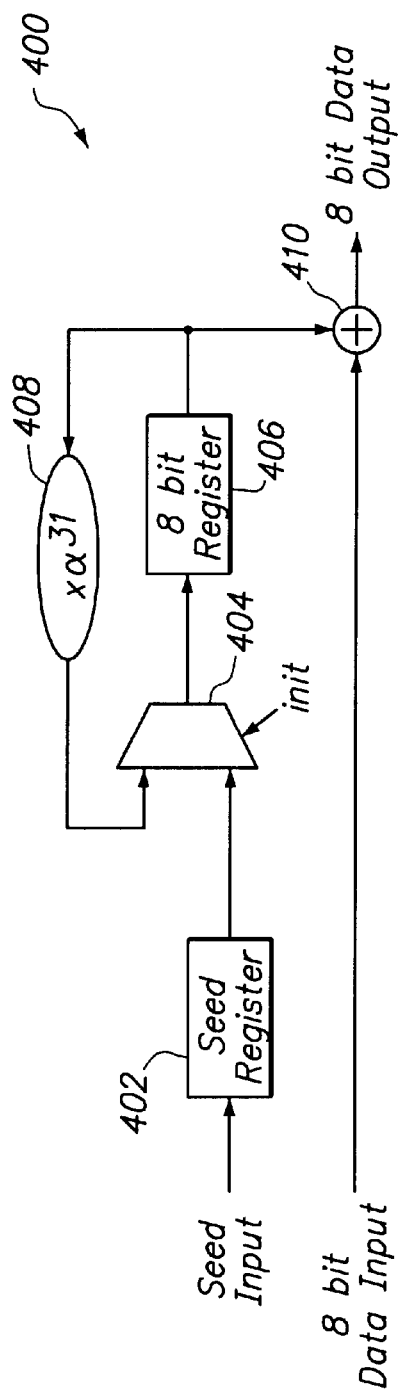
FIG. 4 Randomizer/Derandomizer (Identical for both – only 1 required with I/O Mux's)

O,K,M,/M RECORDING CODE

FIELD OF THE INVENTION

The present invention relates to a method and apparatus for encoding data to be recorded in a data storage device (e.g. a disk drive) according to a run length limited (RLL) code. More particularly, the present invention relates to a method and apparatus for encoding data using a 0,k,m/m recording code. The present invention is particularly well suited for disk drives and other digital data storage devices, but is not necessarily limited to such devices (e.g. it might be used for digital data transmission).

BACKGROUND OF THE INVENTION

Background for the invention will be provided in connection with a disk drive system. It should be noted, however, that the present invention is not intended to be limited to such systems.

FIG. 1 illustrates a conventional disk drive system 100. The disk drive system 100 is operative for performing data storage and retrieval functions for an external host computer 102. The disk drive system 100 includes: a disk 104, a transducer 106, an actuator assembly 108, a voice coil motor (VCM) 110, a read/write channel 112, an encoder/decoder (ENDEC) 114, an error correction coding (ECC) unit 116, a data buffer memory 118, an interface unit 120, a servo unit 122, and a disk controller/microprocessor 124.

In general, disk 104 includes a pair of disk surfaces (not shown) which are coated with a magnetic material that is capable of changing its magnetic orientation in response to an applied magnetic field. Data is stored digitally in the form of magnetic polarity transitions (frequently referred to as pulses) within concentric tracks on one or more of the disk surfaces. The disk 104 is rotated at a substantially constant spin rate by a spin motor (not shown) that is speed-controlled by a closed loop feedback system. Instead of the single disk 104 shown in FIG. 1, the system 100 can include a plurality of disks all mounted on a single spindle and each serviced by one or more separate transducers.

The transducer 106 is a device that transfers information from/to the disk 104 during read and write operations. The transducer 106 is positioned over the disk 104, typically, by a rotary actuator assembly 108 that pivots about an axis under the power of the VCM 110. During a write operation, a polarity-switchable write current is delivered to the transducer 106 from the read/write channel 112 to induce magnetic polarity transitions onto a desired track of the disk 104. During a read operation, the transducer 106 senses magnetic polarity transitions on a desired track of the disk 104 to create an analog read signal that is indicative of the data stored thereon. Commonly, the transducer 106 is a dual element head having a magnetoresistive read element and an inductive write element.

The VCM 110 receives movement commands from the servo unit 122 for properly positioning the transducer 106 above a desired track of the disk 104 during read and write operations. The servo unit 122 is part of a feedback loop that uses servo information from the surface of the disk 104 to control the movement of the transducer 106 and the actuator assembly 108 in response to commands from the controller/microprocessor 124.

During a read operation, the channel 112 receives the analog read signal from the transducer 106 and processes the signal to create a digital read signal representative of the data stored on the disk 104. Typically, detection circuitry is included in the channel 112. The channel 112 may also include means for deriving timing information, such as a read clock, from the analog signal.

The ENDEC 114 is operative for: (1) encoding data being transferred from the host 102 to the disk 104, and (2) decoding data being transferred from the disk 104 to the host 102. Data being written to the disk 104 is encoded for a number of reasons, including those relating to timing and detection concerns. The ENDEC generally imparts a run length limited (RLL) code on the data being written to the disk 104 to ensure that the frequency of transitions in the bit stream does not exceed or fall below predetermined limits. Such coding ensures that, among other things, enough transitions exist in the read data to maintain an accurate read clock. Other coding schemes may also be employed in the ENDEC 114.

The ECC unit 116 is operative for adding redundant information to the data from the host 102 before that data is encoded in the ENDEC 114 and written to the disk 104. This redundant information is used during subsequent read operations to permit discovery of error locations and values within the decoded read data. Errors in the read data detected by the ECC unit 116 can result from any number of mechanisms, such as: (1) media noise due to media anomalies, (2) random noise from the transducer, cabling and electronics, (3) poor transducer placement reducing signal amplitude and/or increasing adjacent track noise during the read operation, (4) poorly written data due to media defects or poor transducer placement, and/or (5) foreign matter on the media or media damage. ECC units are generally capable of correcting up to a predetermined number of errors in a data block. If more that the predetermined number of errors exist, then the code will not be able to correct the errors but may still be able to identify that errors exist within the block. ECC functionality is generally implemented in a combination of hardware and software.

The data buffer memory 118 is used to temporarily store data for several purposes:
(1) to permit data rates that are different between the disk drive and the host interface bus,
(2) to allow time for the ECC system to correct data errors before data is sent to the host 102,
(3) temporary parameter storage for the controller/microprocessor 124, and (4) for data caching.

The interface 120 is used to establish and maintain communication between the host 102 and the disk drive system 100. In this regard, all transfer of information into and out of the disk drive 100 takes place through the interface 120.

The disk controller/microprocessor 124 is operative for controlling the operation and timing of the other elements of the system 100. In addition, the controller/microprocessor 124 may perform the functions of some of the elements of the system. For example, the controller/microprocessor 124 may perform the correction computation function of the ECC unit 116 if errors exceed the capability of the hardware based unit.

With this background, certain drawbacks associated with conventional disk drive encoding and decoding schemes may now be considered.

As alluded to above, clock information is typically embedded into data stored onto the disk 104. In order to ensure that an adequate and timely supply of clock information is provided for the clock extraction process (which is performed by the channel 112), and perhaps for other reasons, run length limited (RLL) codes are employed. As is understood by those skilled in the art (and therefore will not be described herein), detected data includes clock phase error information that is used in the clock extraction process.

RLL codes are traditionally described as d,k codes, where d is the minimum run length and k is the maximum run length between magnetic transitions. Note that two data representation conventions are frequently used, NRZ (non-return to zero) and NRZI (non-return to zero, change on ones). If NRZ, a magnetic polarity transition occurs when a sequence (one or more) of 0's changes to a sequence of 1's, or vice versa. If NRZI, a magnetic polarity transition occurs each time a 1 appears and 0's appear otherwise. While either convention is acceptable and supportable by this invention, NRZ will be used herein to describe the encode and decode processes. Using either convention, d represents the minimum number of bits that must exist between magnetic polarity transitions, while k represents the maximum number bits that may exist between magnetic polarity transitions. The constraint d is used to control pulse crowding effects, while k is used to ensure the aforementioned self-clocking capability and to facilitate error event length control in certain sequence detector systems. Present-day detectors (e.g., Viterbi detectors and the like) usually permit the minimum run length constraint, d, to be 0.

In order to ensure that the maximum run length limitation, k, is appropriately met (and, if necessary, to ensure that the minimum run length, d, is met as well), present-day ENDECs 114 implement a run length limited code by performing a logically complete, immutable and unambiguous mapping between uncoded words (i.e., words of user data, or decoded words) and encoded words (words that are to be stored on the disk surface), wherein the encoded words meet the run length constraints. In order for the run length constraints to be met, the encoded words must necessarily include more bits than the uncoded words, since words that do not satisfy the run length constraints must be discarded from the set of all possible words having the encoded word length.

The number of bits in the uncoded words may be represented by the integer m, while the number of bits in encoded words may be represented by the integer n, with m<n. The code rate of an encoder is then defined by m/n and is, therefore, less than one in conventional systems. Encoders exhibiting code rates of 8/9, 16/17, 24/25 and perhaps higher rates are typical for present-day disk systems.

With respect to an encoder having a code rate of 8/9, for example, one of $2^8$=256 possible uncoded words may be mapped to one of $2^9$=512 possible encoded words. However, of the set of 512 possible encoded words, at least those words that fail to meet the run length constraints are discarded and not used (other excess words are also discarded). Accordingly, only 256 of the 512 possible encoded words are used in the encoding process.

Because the encoding process requires uncoded words having m bits to be mapped to encoded words having n bits (where, in the described examples, n=m+1), overhead is added to the disk drive system 100. Specifically, for a disk drive system 100 with an 8/9 code rate, 1/9th of the user data space on the disk 104 is occupied by unproductive overhead. Similarly, for a disk drive system 100 with a 24/25 code rate, 1/25th of the user data space on the disk 104 is occupied by unproductive overhead. Thus, in an effort to minimize the amount of RLL code overhead, there has been a movement towards designing encoders having higher code rates which implies larger integer m and integer n values, so that the code rate asymptotically approaches, but never quite achieves, the value 1 (i.e., zero code overhead).

However, this never-ending quest for higher code rates by increasing m and n values induces a penalty, i.e., increased decoder error propagation that degrades ECC performance. More particularly, when errors occur in detecting encoded words, there is an average increase in errors associated with mapping encoded words into uncoded words. This average increase in errors occurs because any one encoded error bit may map into one or more decoded error bits, thus potentially into multiple symbols (recognized by the ECC unit 116). Thus, there is a strong correlation between the amount of error propagation and the size of m and n. That is, the larger m and n are, the greater the degree of average error propagation seen by the ECC unit 116.

To compensate for the increased error propagation, more error correction (ECC) symbols may be used. However, using additional ECC symbols translates to additional ECC overhead, thereby degrading (lowering) the ECC system code rate defined as data symbols/(data symbols+ECC symbols). Decreasing ECC system code rate negatively affects the combined code rate defined as the product of RLL code rate×ECC code rate. Thus, the advantages of continuing to increase m and n values reaches a maximum at some point, because the combined code rate will start to decrease.

Another potential issue may arise if m is not an exact multiple of ECC unit symbol sizes, or if ECC symbols and m bit words do not share the same boundaries whenever possible. In this case, additional error propagation is incurred because certain m bit word errors may affect more symbols than necessary due to poor mapping. For most ENDECs in use today, m is chosen to be a multiple of 8 which is not necessarily an ideal choice for the ECC unit symbol size.

Still another lesser problem with using large m and n relates to the inflexibility of sector sizes. Format efficiency is greatest when the sum of data bytes, CRC bytes, and ECC bytes is an exact multiple of m. As m becomes larger, it becomes more constraining and difficult to achieve this goal. If not achieved, format efficiency suffers which has the same effect as negatively affecting the overall system code rate.

Certain developments in read channel technology utilize concatenated recording codes that provide both run length constraints and information redundancy. Information redundancy (e.g., parity codes, turbo codes, etc.) is used to permit signal extraction at reasonable error rates when signals are present with very poor signal-to-noise. It is important that the RLL portion of the concatenated code imposes no harmful constraints on the choice of the redundancy portion of the concatenated code.

Accordingly, there is a strong need to develop a method and apparatus for encoding data to be recorded in a data storage device (e.g. a disk drive) such that the following set of properties are simultaneously achieved: (1) run length limits (RLL) are constrained as needed, (2) code rate of the RLL code equals 1, (3) there is little or no additional error propagation or error rate increase due to the encoding/decoding process, (4) additional errors per sector induced by the encode/decode process never exceed a preset limit, (5) there is no increased error propagation due to selection of ECC unit symbol size that may differ from the uncoded (decoded) word size m, (6) there are minimal constraints that affect sector format efficiency, and (7) no abnormal constraints are imposed when the recording code is concatenated with other codes that may be used to enhance read channel performance, such as parity codes, turbo codes, etc.

SUMMARY OF THE INVENTION

The present invention is designed to minimize the aforementioned problems and meet the aforementioned, and other, needs.

It is an object of the present invention to provide a method and apparatus for encoding data to be recorded in a data storage device (e.g. a disk drive) according to a run length limited (RLL) code that exhibits the following properties: (1) while the d constraint must be 0 (the most common choice today), the k constraint may be arbitrarily chosen to meet the desired maximum run length, although performance is best if maximum run lengths are greater than or equal to 12 for today's standard sector size of 512 bytes, (2) code rate of the RLL code equals 1, (3) there is no added error propagation due to the decoding process (error propagation is only due to the read channel), but there is a small increase in average error rate due to the encoding process (for modest to large k, this increase is significantly less than that incurred due to error propagation of typical RLL codes in use today), (4) additional errors induced by the encode/decode process are limited to a preset limit, (5) the uncoded (decoded) word size m may be arbitrarily selected, for example to match the ECC symbol size, which means that no additional error propagation is incurred because of mismatched m and ECC symbol size, (6) there is zero to minimal sector format inefficiency since m can be chosen to be relatively small, and (7) no abnormal constraints are imposed when the recording code is concatenated with other codes that may be used to enhance read channel performance, such as parity codes, turbo codes, etc.

Unlike conventional systems, the present invention does not use a mapping function that forces n>m (hence, eliminating most of the difficulties of present day RLL codes). Instead, running strings of data bits to be recorded are analyzed logically to determine the number of consecutive 0's and 1's. (Note that this statement and all of the following descriptions assume the NRZ convention. If desired, it is easily convertible into the NRZI convention by those skilled in the art.) If any tested string of bits contains a substring of either 0's or 1's that exceeds the maximum run length k, the (k+1)th bit is inverted (complemented) to force the maximum run length back to k. The test then continues starting from the inverted bit. This bit inversion forces a single bit error since the same bit string, when read back from the disk, is assumed to be uncoded. This single bit error will cause exactly one ECC symbol error, never more as is quite typical for conventional RLL codes. If data is effectively randomized and a reasonable k is selected, average frequency of intentionally-introduced symbol errors is low relative to symbol errors from other causes. Using random data, the model for average number of single bit, intentionally-introduced errors per sector $\lambda=(tb-k)/2^{k+1}$, where tb means total encoded bits in the sector and k is as previously defined. The ECC unit will be required to correct all such errors as well as errors from other causes. Given the additional decoder and remapping error propagation incurred using present-day RLL codes, a significant net gain in ECC unit code rate can be realized since the symbol errors introduced using the present invention are statistically much lower than symbol errors introduced using present-day RLL codes.

In order to minimize the number of intentionally-introduced errors by the encoder, a randomizer is used to randomize the data before encoding. While any effective randomizer may be used, it is usually possible to select one that can improve run lengths relative to those exhibited by truly random data.

After randomization, there may still be a need to ensure that no more than a certain number of intentionally-introduced errors exist within any one sector. If so, the following method may be used to limit the number. A default seed is chosen for the randomizer that is always used to initially write a sector on to the disk. A counter is used to count the number of intentionally-introduced errors. If the number of intentionally-introduced errors exceeds the predetermined limit (a rarity with random data, a reasonable k, and a reasonable error limit), the default seed value is replaced by an alternate seed value and the data to be recorded is rerandomized and rewritten on to the disk. This process may be repeated, if needed, until the number of intentionally-introduced errors is less than or equal to the predetermined maximum.

When an alternate seed is used in the randomization process, one alternative is to store the sector number and randomizer seed in fast, volatile memory and in a non-volatile memory (e.g., on the disk in a specially reserved sector) so that this alternate seed may subsequently be used when derandomizing data read from such sector. Another alternative is to discover the alternate seed by trial and error, e.g., first try the default seed, which almost always works, then if needed, try alternate seeds in sequential order until one is found that works.

A generalization of the above concept of limiting run-length could be made by defining a set of specific undesirable patterns which are problematic to the detector system (timing loop, detector, equalization, etc). The encoder would be designed to detect the presence of any of these specific patterns, invert the last bit of the pattern when detected, thus eliminating the pattern from the data sequence, but introducing a single bit error. For example, in addition to the two patterns for limiting run length (all 0's and all 1's), perhaps a long string of alternating 1's and 0's may also be problematic. In this case two patterns would be added to the list: the alternating pattern starting with a 1, and the alternating pattern starting with a 0. As long as the list of specific patterns is sufficiently short, and the specific patterns themselves are sufficiently long (e.g., >12 bits), the probability of introducing errors in a randomized data stream should remain acceptably low.

Other objects, features and advantages of the invention will be apparent from the following specification taken in conjunction with the following drawings.

BRIEF DESCRIPTION OF THE DRAWINGS

FIG. 2 is a block diagram of one embodiment of a high-level architecture used to implement the present invention;

FIG. 3 is a block diagram of an encoder which may be used in connection with the present invention; and, FIG. 4 is a block diagram of a randomizer which may be used in connection with the present invention.

DETAILED DESCRIPTION OF THE PREFERRED EMBODIMENT

Figure 1:
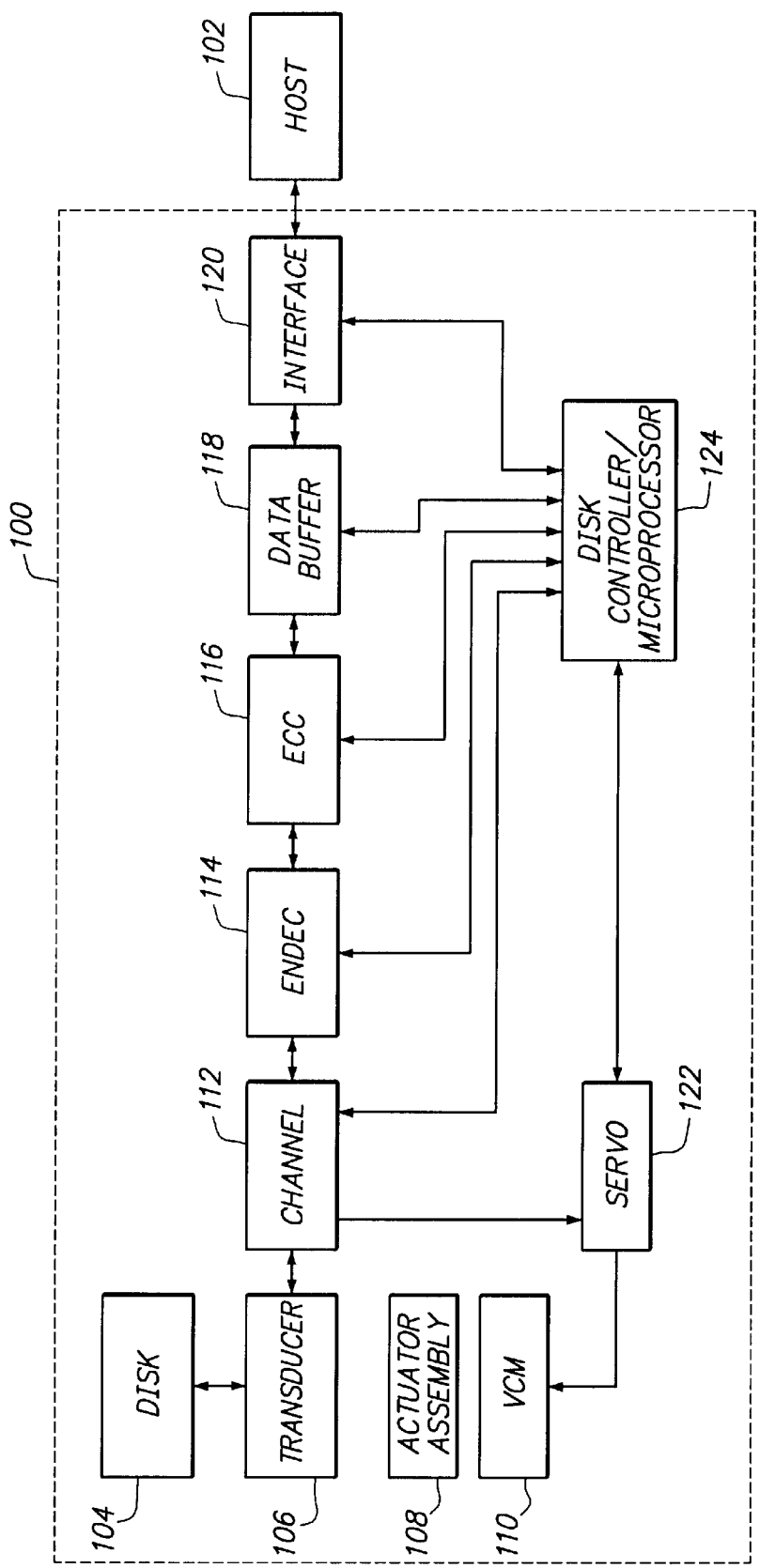
FIG. 1 is a block diagram showing certain functional components of a conventional disk drive 100, wherein the disk drive 100 is coupled to a host computer 102.

While this invention is susceptible of embodiments in many different forms, there are shown in the drawings and will herein be described in detail, preferred embodiments of the invention with the understanding that the present disclosure is to be considered as an exemplification of the principles of the invention and is not intended to limit the broad aspects of the invention to the embodiments illustrated.

As noted above, the present invention provides a method and apparatus for encoding data to be recorded in a data storage device (e.g. a disk drive) according to a run length limited (RLL) code that exhibits the following properties: (1) while the d constraint must be 0 (the most common choice today), the k constraint may be arbitrarily chosen to meet the desired maximum run length, although performance is best if typical maximum run lengths are greater than or equal to 12 for today's standard sector size of 512 bytes, (2) code rate of the RLL code equals 1, (3) there is no added error propagation due to the decoding process (error propagation is only due to the read channel), but there is a small increase in average error rate due to the encoding process (for modest to large k, this increase is significantly less than that incurred due to error propagation of typical RLL codes in use today), (4) additional errors induced by the encode/decode process are limited to a preset limit, (5) the uncoded (decoded) word size m may be arbitrarily selected, for example to match the ECC symbol size, which means that no additional error propagation is incurred because of mismatched m and ECC symbol size, (6) there is zero to minimal sector format inefficiency since m can be chosen to be relatively small, and (7) no abnormal constraints are imposed when the recording code is concatenated with other codes that may be used to enhance read channel performance, such as parity codes, turbo codes, etc.

In the present invention, running strings of data bits to be recorded are analyzed logically to determine the number of consecutive 0's and 1's. If any tested string of bits contains a substring of either 0's or 1's that exceeds the maximum run length k, the (k+1)th bit is inverted (complemented) to force the maximum run length back to k. The test then continues starting from the inverted bit. This bit inversion forces a single bit error since the same bit string when read back from the disk is assumed to be uncoded. This single bit error will cause exactly one ECC symbol error, never more as is quite typical for conventional RLL codes. If data is well randomized and a reasonable k is selected, frequency of single bit errors is low relative to other error causes. Errors from all causes are corrected using the error correction coding (ECC) unit.

In order to minimize the number of intentionally-introduced errors by the encoder, a randomizer is used to randomize the data before encoding. While any effective randomizer may be used, it is usually possible to select one that can improve run lengths relative to those exhibited by truly random data. Detailed discussion of this issue is provided later.

After randomization, there may still be a need to ensure that no more than a certain number of intentionally-introduced errors exist within any one sector. If so, the following method may be used to limit the number. A default seed is chosen for the randomizer that is always used to initially write a sector on to the disk. A counter is used to count the number of intentionally-introduced errors. If the number of intentionally-introduced errors exceeds the predetermined limit (a rarity with random data, a reasonable k, and a reasonable error limit), the default seed value is replaced by an alternate seed value and the data to be recorded is rerandomized and rewritten on to the disk. This process may be repeated, if necessary, until the number of intentionally-introduced errors is less than or equal to the predetermined maximum.

When an alternate seed is used in the randomization process, one alternative is to store the sector number and randomizer seed in fast, volatile memory and in a non-volatile memory (e.g., on the disk in a specially reserved sector) so that this alternate seed may subsequently be used when derandomizing data read from such sector. Another alternative is to discover the alternate seed by trial and error, e.g., first try the default seed, which almost always works, then if needed, try alternate seeds in sequential order until one is found that works.

A generalization of the above concept of limiting run-length could be made by defining a set of specific undesirable patterns which are problematic to the detector system (timing loop, detector, equalization, etc). The encoder would be designed to detect the presence of any of these specific patterns, invert the last bit of the pattern when detected, thus eliminating the pattern from the data sequence, but introducing a single bit error. For example, in addition to the two patterns for limiting run length (all 0's and all 1's), perhaps a long string of alternating 1's and 0's was also problematic. In this case two patterns would be added to the list: the alternating pattern starting with a 1, and the alternating pattern starting with a 0. As long as the list of specific patterns is sufficiently short, and the specific patterns themselves are sufficiently long (e.g., >12 bits), the probability of introducing errors in a randomized data stream should remain acceptably low. For the remainder of this disclosure, the implementation described will be specific to the task of limiting run-length only, but this is not intended limit the application of this technique to the more general application.

FIG. 2 is a simplified block diagram of one embodiment of the present invention, which illustrates both the write and read processes that include the "encoding" and "decoding" processes. (The words encoding and decoding are in quotes because the encoder and decoder used are not typical. In fact, no decoder is used at all.) For ease of understanding, first an overview of the write process and encoding process will be presented; then, a more detailed discussion of the encode process will be provided.

For the write process, the embodiment shown in FIG. 2 (in functional form) includes an ECC unit 202, a randomizer 204, an encoder 206 and access to the controller/microprocessor for execution of the reseed/rewrite function via the "reseed flag" output and the "randomizer seed" input. Data, packaged in the form of words (e.g., 8 bit words), is presented to an 8-to-9 bit converter 201 and then to the ECC unit 202. As will be understood by those skilled in the art, such data may include user data with CRC bytes appended thereto. As will also be understood by those skilled in the art, the 8-to-9 bit converter 201 is not an essential component of the invention, as it is merely being used to package bytes of data into the form needed by the ECC unit 202, if and only if the ECC unit requires 9 bit symbols as is the case in the present embodiment. (Likewise, the 9-to-8 bit converter 203 is not an essential component of this invention. This embodiment illustrates the ease with which the ECC symbol size may differ from the data word size and/or the read channel word size without incurring any penalty for doing so.)

The ECC unit 202 performs an ECC computation and adds redundant information (in the form of additional symbols, and therefore bytes) to the data so that errors may subsequently be detected and corrected during the read process. The data, with ECC information appended thereto, is then repackaged from 9 bit symbols into 8 bit words using the 9-to-8 bit converter 203 and is then delivered to the randomizer 204.

The data received by the randomizer 204 is then randomized on a word-by-word basis (e.g., 8 bit words in the present embodiment). The randomization process is important, because an effective randomizer will prevent a large number of errors from being intentionally introduced by the encoder 206, as will be better understood from the description below.

Randomized words are then delivered to the encoder 206 as strings of bits in registers.

The encoder 206 operates to logically analyze running strings of data bits to determine the number of consecutive 0's and 1's. If any tested string of bits contains a substring of either 0's or 1's that exceeds the maximum run length k, the (k+1)th bit is inverted (complemented) to force the maximum run length back to k. The test then continues starting from the inverted bit. The data is then provided to the channel (not shown) as data words (again, usually, but not necessarily 8 bits in length). Once received by the channel, data is stored on the disk surface in the form of transitions on a bit-by-bit basis.

For the read process, the preferred architecture of the present invention (shown in functional form in the lower portion of FIG. 2) includes a derandomizer 208, an ECC unit 210 and a buffer 212. No decoder is used since data, as read by the channel, is assumed to be uncoded. Following FIG. 2 from right to left, data detected by the read channel (not shown) is delivered as data words (usually, but not necessarily, as 8 bit words) to the derandomizer 208, which performs a derandomization process on the detected data to return the data to its derandomized form. The derandomized data is then delivered as words (e.g., 8 bit words) to a 8-to-9 bit converter 209, so that the ECC unit 210 is able to receive the data in the necessary 9 bit symbol size for this particular embodiment. The derandomized 9 bit data is also provided to the buffer 212, where it is stored until the ECC unit 210 performs its function. (Again, the 8-to-9 bit converter 209 and the 9-to-8 bit converter 213 are not essential components of the invention.)

As will be understood by those skilled in the art, after the entire sector of data is derandomized and provided to the ECC unit 210, the ECC unit 210 then determines whether the data includes any errors. If no errors are detected by the ECC unit 210, the buffer 212 delivers the data to the 9-to-8 bit converter 213. Data is then output from the 9-to-8 bit converter 213 and delivered to the host computer (not shown), perhaps again repackaged to match the host interface. If errors are detected by the ECC unit 210 (for example, due to a bit being inverted, or perhaps other causes), the ECC unit 210 operates to correct the errors. Data correction vectors from the ECC unit 210 amend data in the buffer 212. The buffer 212 then delivers corrected data to the 9-to-8 bit converter 213 and then to the host computer (not shown).

Reference is again made to the upper portion of FIG. 2. Because user data may, in many instances, be quite repetitive (i.e., include a large number of consecutive, repeated bytes, or consecutive, repeated multiple byte words), the randomizer 204 is used to remove such repetitions (also known as uncorrelating the data). For example, bit map data may be especially problematic, since such data is quite repetitive on a byte-by-byte, or word-by-word (multiple byte word) basis.

Preferably, the randomizer 204 ensures that data is presented to the encoder 206 in a better than random fashion. In other words, a particular randomizer 204 is chosen in an effort to uncorrelate data such that its likelihood of introducing long strings of consecutive 0's and 1's is lower (better) than if the data were truly random. Appropriate randomizers may be selected on a trial-and-error basis by using typical computer data in the trial-and-error process. A description of one preferred randomizer is provided later.

Given the possibility that either of two causes may induce an excessive number of encoder errors, a method is provided to limit such errors: (1) while a statistical rarity, certain user data patterns might accidentally create more encoder errors than are tolerable, or (2) a user might intentionally create a stress test (diabolical test) that forces an excess of errors. Both of these possible causes may be defeated by accumulating a running count of encoder-introduced errors when the randomizer is using the standard (default) seed, then reseeding the randomizer with an alternate seed and rewriting the sector if the count is excessive. If the limit of permissible errors is high enough and the available number of alternate seeds is high enough relative to the sector size, it will be impossible to prevent successful writing of an acceptable sector.

Subsequently, when such a sector is read, it will ultimately be necessary to use the final randomizer seed to read the sector correctly. While there are a number of possible methods for ensuring that the correct seed is used, the preferred method for doing so is: (1) maintain a log of sectors that require a seed other than the default seed along with the seed that was finally used for each such sector, (2) initially use the default seed to read all sectors (if the data was randomized using a different seed, the data will be uncorrectable by the ECC system), (3) if the read operation fails, check the log to determine if the sector that failed is in the log of sectors requiring alternate seeds, (4) if the target sector is in the log, reseed the randomizer with the correct seed and reread the sector, (5) if it succeeds, the operation is complete, (6) if not, or if the target sector is not in the log, use all other error recovery procedures that are supported by the system. Note that the order of the randomizer and the ECC system is important to this method of operation. That is, the ECC system detects that the data may have been randomized using a non-default seed by being unable to recover the data.

If a log of sectors requiring alternate seeds is maintained, it needs to be checked each time a sector is written or rewritten, then updated as necessary. If a newly written sector requires an alternate seed, it must be entered into the log with the alternate seed value (or seed index) that was finally used. Likewise, if a sector is rewritten, and if it had previously appeared in the log, it may be necessary to either delete the entry or replace the seed value (or seed index). The log should be permanently retained on the disk in a sector reserved for system data, or in non-volatile, writeable memory. Since the log needs to be frequently accessed and scanned, number of log entries should be very small (usually zero) and it should be initially accessible by the controller/ microprocessor from fast, volatile memory so that no performance loss is experienced.

An alternative method to the preferred method described above is to not maintain a log of sectors that have been written with an alternate seed. Instead, during a subsequent read operation, use the default seed for the first attempt at derandomization. If the read succeeds (it virtually always will), the operation is complete. If it does not succeed, reread and derandomize using alternate seeds in succession until one is found that permits a correct read of the sector.

FIG. 3 is a block diagram illustrating one embodiment of an encoder 300. The encoder 300 includes: a first 8 bit register 302, an XOR unit 304, an encode logic block 306, a multiplexer 308, a second 8 bit register 310, a third 8 bit register 312, an 8 bit wide OR gate 314, a 3 bit down counter 316, and a 3 bit wide NOR gate 318.

The first 8 bit register 302 is initially loaded with the first data byte. Because a synch word precedes the start of data, the second 8 bit register 310 is initially loaded with the final 8 bits of the synch word via the multiplexer 308 to prevent an excessive run length in the combination of the synch word with the first data bytes. The initial contents of the third 8 bit register 312 are immaterial. Then, the set of 24 bits in the three registers are logically analyzed by the encode logic block 306 to determine if any sub-string exceeds the run length limit (either 15 or 16 bits in the preferred embodiment, depending upon the set of logic used). If the run length is not exceeded, the encode logic block 306 outputs a 0 byte. Conversely, if the run length is exceeded, the encode logic block 306 outputs a byte that contains a 1 bit in the proper bit position such that it causes an inversion of the (k+1)th bit. This output byte is XORed with the contents of the first 8 bit register 302 as its contents are forwarded to both the second 8 bit register 310 and to the read channel. Thus, run lengths are constrained to a maximum of k consecutive 0's and 1's.

As each subsequent data byte is received, it is loaded into the first 8 bit register 302. Meanwhile, current contents of the first 8 bit register 302 are shifted into the second 8 bit register 310 via the multiplexer 308, current contents of the second 8 bit register 310 are shifted into the third 8 bit register 312, and current contents of the third 8 bit register are discarded. After each new data byte is loaded and current contents are shifted or discarded, the set of 24 bits in the three registers are analyzed by the encode logic block 306 and the (k+1)th bit is inverted if necessary, as previously described.

The encoder 300 shown in FIG. 3 depicts a maximum run length of either k=16 or k=15. Depending upon which run length is selected, logic for converting the 24 input bits to the 8 output bits needs to be used. One description of the logic is shown below (other logically-equivalent descriptions are equally acceptable and assumed) in conventional notation, except that ! represents NOT rather than the conventional over bar. Bits in the output byte (the amendment vector) are represented by a7–a0, while bits in the first 8 bit register 302, second 8 bit register 310 and third 8 bit register 312 are represented by r07–r00, r17–r10, and r27–r20 respectively.

k=16 Logic:
State Logic:
c0=r07+r10+r11+r12+r13+r14+r15+r16+r17+r20
c1=r07 r10 r11 r12 r13 r14 r15 r16 r17 r20
Encode Logic:
a7=!(c0+r21+r22+r23+r24+r25+r26+r27)+(c1 r21 r22 r23 r24 r25 r26 r27)
a6=!a7 [!(r06+c0+r21+r22+r23+r24+r25+r26)+(r06 c1 r21 r22 r23 r24 r25 r26)]
a5=!a7 !a6 [!(r05+r06+c0+r21+r22+r23+r24+r25)+(r05 r06 c1 r21 r22 r23 r24 r25)]
a4=!a7 !a6 !a5 [!(r04+r05+r06+c0+r21+r22+r23+r24)+(r04 r05 r06 c1 r21 r22 r23 r24)]
a3=!a7 !a6 !a5 !a4 [!(r03+r04+r05+r06+c0+r21+r22+r23)+(r03 r04 r05 r06 c1 r21 r22 r23)]
a2=!a7 !a6 !a5 !a4 !a3[!(r)2+r03+r04+r05+r06+c0+r21+r22)+(r02 r03 r04 r05 r06 c1 r21 r22)]
a1=!a7 !a6 !a5 !a4 !a3 !a2 [!(r01+r02+r03+r04+r05+r06+c0+r21)+(r01 r02 r03 r04 r05 r06 c1 r21)]
a0=!a7 !a6 !a5 !a4 !a3 !a2 !a1 [!(r00+r01+r02+r03+r04+r05+r06+c0)+(r00 r01 r03 r04 r05 r06 c1)]
k=15 Logic:
State Logic:
c0=r07+r10+r11+r12+r13+r14+r15+r16+r17
c1=r07 r10 r11 r12 r13 r14 r15 r16 r17
Encode Logic:
a7=!(c0+r20+r21+r22+r23+r24+r25+r26)+(c1 r20 r21 r22 r23 r24 r25 r26)
a6=!a7 [!(r06+c0+r20+r21+r22+r23+r24+r25)+(r06 c1 r20 r21 r22 r23 r24 r25)]
a5=!a7 !a6 [!(r05+r06+c0+r20+r21+r22+r23+r24)+(r05 r06 c1 r20 r21 r22 r23 r24)]
a4=!a7 !a6 !a5 [!(r04+r05+r06+c0+r20+r21+r22+r23)+(r04 r05 r06 c1 r20 r21 r22 r23)]
a3=!a7 !a6 !a5 !a4 [!(r03+r04+r05+r06+c0+r20+r21+r22)+(r03 r04 r05 r06 c1 r20 r21 r22))]
a2=!a7 !a6 !a5 !a4 !a3 [!(r02+r03+r04+r05+r06+c0+r20+r21)+(r02 r03 r04 r05 r06 c1 r20 r21)]
a1=!a7 !a6 !a5 !a4 !a3 !a2 [!(r01+r02+r03+r04+r05+r06+c0+r20)+(r01 r02 r03 r04 r05 r06 c1 r20)]
a0=!a7 !a6 !a5 !a4 !a3 !a2 !a1 [!(r00+r01+r02+r03+r04+r05+r06+c0)+(r00 r01 r02 r03 r04 r05 r06 c1)]

The 8 input OR gate 314 is used to determine if an error has been introduced into any of the output bytes. If the output byte of the encode logic block 306 does not contain all 0 bits, it is known that an error has been introduced. Therefore, if the 8 input OR gate outputs a 1, it is known that an error has been introduced.

The 3 bit down counter 316 is initialized with the error limit number plus 1 (i.e., the number that is one greater than the maximum number of permissible errors introduced). Each time the 8 input OR gate 314 outputs a 1 bit, the down counter 316 is decremented. If it reaches 0, it is known that the maximum number of errors introduced has been exceeded. The 3 input NOR gate then outputs a 1 indicating that a reseed and rewrite is necessary. Using a 3 bit down counter, up to 6 introduced errors can be accommodated. If more are necessary, the down counter size must be increased.

It will be obvious to those skilled in the art that other implementations performing the same functions are easily possible. It will also be obvious to those skilled in the art that other parameters may easily be set, e.g., other word sizes, other k, other maximum number of introduced errors, etc.

FIG. 4 is a diagram of a simple Galois field randomizer 400 that is used in the preferred embodiment of the present invention. While there are a vast number of different randomizers that may be used in the randomization process of the present invention, the inventors of the present invention have experimentally determined that a Galois field randomizer is quite effective as well as being very cost effective. The particular Galois field randomizer was chosen because it is effective at breaking up typical correlated data such that frequency of long run lengths is better than random data (based upon the typical data tested) and is very cost effective to implement.

The randomizing process involves bit-wise XORing a so-called pseudo-random number to the data coming into the randomizer. The derandomizing process involves performing the randomizing process again (i.e., bit-wise XORing the same pseudo-random number to the randomized data, in fact using the same hardware as the randomizer since write and read operations are never simultaneously performed), which restores the randomized data to its original state, except for the possible inclusion of errors.

As shown in FIG. 4, the Galois field randomizer 400 includes a seed register 402, a multiplexer 404, an 8 bit register 406, a Galois field multiplier unit 408, and an XOR unit 410. The default seed in the preferred embodiment is 00000001 which is provided to the seed register 402, passed through the multiplexer 404 and placed in the 8 bit register 406. A bit-wise XOR process is then performed on the first input data byte by feeding both the value in the 8 bit register 406 and the data byte to the XOR unit 410. The randomized byte (output of the XOR unit 410) is then output to the encoder (see FIG. 2). Meanwhile, the contents of the 8 bit register 406 are provided to the Galois field multiplier 408, which multiplies the contents of the 8 bit register 406 by the Galois field element $\alpha^{31}$ to achieve a new value which is then inserted into the 8 bit register 406 via the multiplexer 404. By doing so, the Galois field is stepped through in end-around fashion in increments of $\alpha^{31}$. This process is repeated each time a new data byte is entered. The Galois field multiply-by-constant element $\alpha^{31}$, is based upon GF($2^8$) generated by the primitive polynomial $x^8+x^4+x^3+x^2+1$. It should be understood that the selection of the multiply-by-constant element and the primitive polynomial are not necessarily limited; other selections may work equally well, less well, or even better. However, the inventors of the present invention have experimentally determined that selections in the preferred embodiment are quite effective on typical user data and typical system data. Those skilled in the art can easily implement the above randomizer, or other randomizers.

Referring again to FIG. 4, if the default seed induces too many written-in errors, an alternate seed will be provided to the seed register 402 by the controller/microprocessor, via the seed input. There are obviously 255 seeds (1 default and 254 alternate seeds) for the 8 bit randomizer 400 shown in FIG. 4. Of course, if a q bit randomizer was used, there could potentially be 2q–1 possible seeds.

It should be understood that the present invention is not to be limited to Galois field randomizers and specifically not limited to the Galois field randomizer 400 shown in FIG. 4. Instead, any randomizer 204 is acceptable if it provides sufficiently randomized data to the encoder 206, so that an excessive number of errors are not intentionally-introduced by the encoder 206, so that an excessive number of reseeds do not have to be performed and so that a sufficient number of alternate seeds are available.

While an effort has been made to describe some alternatives to the preferred embodiment, other alternatives will readily come to mind to those skilled in the art. Therefore, it should be understood that the invention may be embodied in other specific forms without departing from the spirit or central characteristics thereof. The present examples and embodiments, therefore, are to be considered in all respects as illustrative and not restrictive, and the invention is not intended to be limited to the details given herein.

What is claimed is:

1. A method for encoding data to meet a maximum run length limitation k, the method comprising the steps of:
    randomizing data using a default seed, wherein said randomized data includes a plurality of bits and wherein said bits have a value of 1 or 0;
    analyzing said randomized data to determine whether a number of consecutive bits having a common value exceeds the maximum run length limitation k; and,
    inverting the value of a bit, when the number of consecutive bits having a common value exceeds the maximum run length limitation k.

2. The method of claim 1 including the step of storing representations of each of the plurality of bits, including any inverted bits, onto a disk surface as magnetic-polarity transitions.

3. The method of claim 2 including the step of reading the stored magnetic-polarity transitions from the disk surface and recovering the plurality of bits, including any inverted bits.

4. The method of claim 3 including the step of inverting the value of the inverted bit to its original value.

5. The method of claim 4 wherein the plurality of bits includes user data and said user data is provided to a host computer.

6. The method of claim 4 wherein the inverted bit is returned to its original value by an ECC unit based upon an ECC computation that was performed on said data.

7. A method for encoding data to meet a maximum run length limitation k, the method comprising the steps of:
    providing user data that includes a plurality of bits, wherein said bits have a value of 1 or 0;
    performing an ECC computation on said plurality of user data bits to add ECC symbols in the form of a plurality of ECC bits;
    randomizing the plurality of user data bits and said plurality of ECC bits using a default seed;
    analyzing said randomized user data bits and ECC bits to determine whether a number of consecutive bits have a common value; and,
    inverting the value of a bit, when the number of consecutive bits having a common value exceeds the maximum run length limitation k.

8. The method of claim 7 including the step of counting the number of inverted bits.

9. The method of claim 8 wherein if the number of inverted bits exceeds a predetermined value, a seed different from the default seed is used.

10. The method of claim 9 wherein the seed has a value which is stored in memory and is associated with a particular sector.

11. The method of claim 10 wherein the value of the seed is stored on a disk surface of a disk drive prior to powering down said disk drive.

12. The method of claim 11 wherein the value of the seed is read from the disk surface and stored in memory upon powering up said disk drive.

13. The method of claim 8 wherein the number of inverted bits are counted per sector of a disk onto which the user data is to be stored.

14. The method of claim 7 wherein the randomizing step is performed by a Galois field randomizer.

15. The method of claim 7 including the step of storing representations of each of the randomized user bits and ECC bits, including any inverted bits, onto a disk surface as magnetic-polarity transitions.

16. The method of claim 15 including the step of reading the stored magnetic-polarity transitions from the disk surface and recovering the randomized user bits and ECC bits, including any inverted bits.

17. The method of claim 16 including the step of derandomizing the randomized user bits and ECC bits.

18. The method of claim 17 including the step of inverting the value of the inverted bit to its original value using the ECC computations.

19. The method of claim 18 wherein the plurality of bits includes user data and said user data is provided to a host computer.

20. The method of claim 16 including the step of attempting to derandomize the randomized user bits and ECC bits using said default seed.

21. The method of claim 20 including the step of using a seed different from the default seed to derandomize the randomized user bits and ECC bits.

22. A method comprising the steps of:
    randomizing data using a default seed, wherein said randomized data includes a string of bits and wherein said bits have a value of 1 or 0;

testing said string of bits to determine whether said string of bits equals a predetermined value; and, inverting the value of a bit within the string of bits when said string of bits equals said predetermined value.

23. The method of claim 22 including the step of storing representations of each of the bits in said string of bits, including any inverted bits, onto a disk surface as magnetic-polarity transitions.

24. The method of claim 23 including the step of reading the stored magnetic-polarity transitions from the disk surface and recovering the string of bits, including any inverted bits.

25. The method of claim 24 including the step of inverting the value of the inverted bit to its original value.

26. The method of claim 25 wherein the plurality of bits include user data and said user data is provided to a host computer.

27. The method of claim 25 wherein the inverted bit is returned to its original value by an ECC unit.

28. A method for encoding data to avoid an offensive string of bits, the method comprising the steps of:

providing user data that includes a plurality of bits, wherein said bits have a value of 1 or 0;

performing an ECC computation on said user data to add ECC symbols in the form of a plurality of ECC bits;

randomizing the plurality of user data bits and said plurality of ECC bits using a default seed;

testing said plurality of randomized user data bits and said plurality of randomized ECC bits to determine whether they include an offensive string of bits; and, inverting the value of a bit when the tested bits include the offensive string of bits.

29. The method of claim 28 including the step of counting the number of inverted bits.

30. The method of claim 29 wherein if the number of inverted bits exceeds a predetermined value, a seed different from the default seed is used.

31. The method of claim 31 wherein the seed has a value which is stored in memory and is associated with a particular sector.

32. The method of claim 31 wherein the value of the seed is stored on a disk surface of a disk drive prior to powering down said disk drive.

33. The method of claim 32 wherein the value of the seed is read from the disk surface and stored in memory upon powering up said disk drive.

34. The method of claim 29 wherein the number of inverted bits are counted per sector of a disk onto which the user data is to be stored.

35. The method of claim 28 wherein the randomizing step is performed by a Galois field randomizer.

36. The method of claim 28 including the step of storing representations of each of the randomized user bits and ECC bits, including any inverted bits, onto a disk surface as magnetic-polarity transitions.

37. The method of claim 36 including the step of reading the stored magnetic-polarity transitions from the disk surface and recovering the randomized user bits and ECC bits, including any inverted bits.

38. The method of claim 37 including the step of derandomizing the randomized user bits and ECC bits.

39. The method of claim 38 including the step of inverting the value of the inverted bit to its original value using the ECC computations.

40. The method of claim 39 wherein the plurality of bits include user data and said user data is provided to a host computer.

41. The method of claim 37 including the step of attempting to derandomize the randomized user bits and ECC bits using said default seed.

42. The method of claim 41 including the step of using a seed different from the default seed to derandomize the randomized user bits and ECC bits.

43. A method for encoding data to meet a maximum run length limitation k, the method comprising the steps of:

randomizing data using a default seed, wherein said randomized data includes a plurality of bits and wherein said bits have a value of 1 or 0;

analyzing said data to determine whether a number of consecutive bits having a value of 0 exceeds the maximum run length limitation k; and, inverting the value of a bit, when the number of consecutive bits having a value of 0 exceeds the maximum run length limitation k.

44. The method of claim 43 including the step of storing representations of each of the plurality of bits, including any inverted bits, onto a disk surface as magnetic-polarity transitions.

45. The method of claim 44 including the step of reading the stored magnetic-polarity transitions from the disk surface and recovering the plurality of bits, including any inverted bits.

46. The method of claim 45 including the step of inverting the value of the inverted bit to its original value.

47. The method of claim 46 wherein the plurality of bits include user data and said user data is provided to a host computer.

48. The method of claim 46 wherein the inverted bit is returned to its original value by an ECC unit based upon an ECC computation that was performed on said data.

49. A method for encoding data to meet a maximum run length limitation k, the method comprising the steps of:

providing user data that includes a plurality of bits, wherein said bits have a value of 1 or 0;

performing an ECC computation on said plurality of user data bits to add ECC symbols in the form of a plurality of ECC bits;

randomizing the plurality of user data bits and said plurality of ECC bits using a default seed;

analyzing said randomized user data bits and ECC bits to determine whether a number of consecutive bits have a value of 0; and, inverting the value of a bit, when the number of consecutive bits having a value of 0 exceeds the maximum run length limitation k.

50. The method of claim 49 including the step of counting the number of inverted bits.

51. The method of claim 50 wherein if the number of inverted bits exceeds a predetermined value, a seed different from the default seed is used.

52. The method of claim 51 wherein the seed has a value which is stored in memory and is associated with a particular sector.

53. The method of claim 52 wherein the value of the seed is stored on a disk surface of a disk drive prior to powering down said disk drive.

54. The method of claim 53 wherein the value of the seed is read from the disk surface and stored in memory upon powering up said disk drive.

55. The method of claim 50 wherein the number of inverted bits are counted per sector of a disk onto which the user data is to be stored.

56. The method of claim 49 wherein the randomizing step is performed by a Galois field randomizer.

57. The method of claim 49 including the step of storing representations of each of the randomized user bits and ECC bits, including any inverted bits, onto a disk surface as magnetic-polarity transitions.

58. The method of claim 57 including the step of reading the stored magnetic-polarity transitions from the disk surface and recovering the randomized user bits and ECC bits, including any inverted bits.

59. The method of claim 58 including the step of derandomizing the randomized user bits and ECC bits.

60. The method of claim 59 including the step of inverting the value of the inverted bit to its original value using the ECC computations.

61. The method of claim 60 wherein the plurality of bits include user data and said user data is provided to a host computer.

62. The method of claim 58 including the step of attempting to derandomize the randomized user bits and ECC bits using said default seed.

63. The method of claim 62 including the step of using a seed different from the default seed to derandomize the randomized user bits and ECC bits.

64. The method of claim 1 including the step of performing a bit-by-bit test to determine the number of consecutive bits having a common value.

65. The method of claim 1 including the step of testing strings of bits to determine the number of consecutive bits having a common value.

66. The method of claim 7 including the step of performing a bit-by-bit test to determine the number of consecutive bits having a common value.

67. The method of claim 7 including the step of testing strings of bits to determine the number of consecutive bits having a common value.

68. The method of claim 43 including the step of performing a bit-by-bit test to determine the number of consecutive bits having a common value.

69. The method of claim 43 including the step of testing strings of bits to determine the number of consecutive bits having a common value.

70. The method of claim 49 including the step of performing a bit-by-bit test to determine the number of consecutive bits having a common value.

71. The method of claim 49 including the step of testing strings of bits to determine the number of consecutive bits having a common value.

* * * * *